US010453787B2

(12) United States Patent
Karpman et al.

(10) Patent No.: US 10,453,787 B2
(45) Date of Patent: Oct. 22, 2019

(54) METHOD AND APPARATUS FOR FORMING MULTI-LAYERED VIAS IN SEQUENTIALLY FABRICATED CIRCUITS

(71) Applicant: The Charles Stark Draper Laboratory, Inc., Cambridge, MA (US)

(72) Inventors: Maurice S. Karpman, Brookline, MA (US); Nicole S. Mueller, Cambridge, MA (US); Gary B. Tepolt, Pelham, NH (US); Russell Berman, Cambridge, MA (US)

(73) Assignee: THE CHARLES STARK DRAPER LABORATORY, INC., Cambridge, MA (US)

( * ) Notice: Subject to any disclaimer, the term of this patent is extended or adjusted under 35 U.S.C. 154(b) by 95 days.

(21) Appl. No.: 15/160,303

(22) Filed: May 20, 2016

(65) Prior Publication Data
US 2016/0343652 A1 Nov. 24, 2016

Related U.S. Application Data

(60) Provisional application No. 62/164,782, filed on May 21, 2015.

(51) Int. Cl.
*H01L 21/48* (2006.01)
*H01L 23/498* (2006.01)
(Continued)

(52) U.S. Cl.
CPC ...... *H01L 23/49838* (2013.01); *H01L 21/486* (2013.01); *H01L 21/4857* (2013.01);
(Continued)

(58) Field of Classification Search
CPC . H05K 1/02; H05K 1/11; H05K 1/186; H05K 3/00; H05K 3/40; H05K 3/46; H05K 3/0047; H05K 3/4602; H05K 3/4608; H05K 3/4069; H05K 3/4623; H01L 21/48; H01L 21/486; H01L 21/4857; H01L 21/50; H01L 21/561; H01L 21/568; H01L 21/6835; H01L 21/768; H01L 23/498; H01L 23/147; H01L 23/49827; H01L 23/49838; H01L 23/5226; H01L 23/49822; H01L 23/3128; H01L 23/5384; H01L 24/11; H01L 24/19; H01L 24/20; H01L 24/24; H01L 24/25;
(Continued)

(56) References Cited

U.S. PATENT DOCUMENTS 4,566,186 A * 1/1986 Bauer ............... H05K 3/4069
29/830
7,608,534 B2 10/2009 Yun et al.
(Continued)

*Primary Examiner* — Timothy J Thompson
*Assistant Examiner* — Guillermo J Egoavil
(74) *Attorney, Agent, or Firm* — Womble Bond Dickinson (US) LLP; John J. Penny, Jr.

(57) ABSTRACT

An electronic module assembly including a via spanning multiple layers in a wafer based module is described. The electronic module assembly can include a first layer deposited upon a substrate, a second layer deposited on a top surface of the first layer, and the via spanning multiple layers. The via can include a first bottom that is formed on a top surface of the first layer and a first sidewall that upstands from the first bottom and extending at least through the second layer.

11 Claims, 7 Drawing Sheets

(51) Int. Cl.
  *H05K 1/02* (2006.01)
  *H05K 1/11* (2006.01)
  *H05K 3/00* (2006.01)
  *H05K 3/40* (2006.01)
  *H05K 3/46* (2006.01)
  *H01L 23/14* (2006.01)
  *H01L 23/522* (2006.01)

(52) U.S. Cl.
  CPC ...... *H01L 23/147* (2013.01); *H01L 23/49822* (2013.01); *H01L 23/49827* (2013.01); *H01L 23/5226* (2013.01)

(58) Field of Classification Search
  CPC ....... H01L 24/82; H01L 24/97; H01L 25/105; Y10T 29/49155
  USPC .................................. 174/250, 251; 438/122
  See application file for complete search history.

(56) References Cited

U.S. PATENT DOCUMENTS

| | | | |
|---|---|---|---|
| 8,343,810 B2 * | 1/2013 | Oh | H05K 1/186 257/E23.136 |
| 2013/0062101 A1 * | 3/2013 | Kanai | H05K 3/4069 174/251 |
| 2015/0084194 A1 * | 3/2015 | Molzer | H01L 23/481 257/741 |
| 2015/0325497 A1 * | 11/2015 | Yu | H01L 21/31116 257/774 |
| 2016/0113139 A1 | 4/2016 | Karpman | |

* cited by examiner

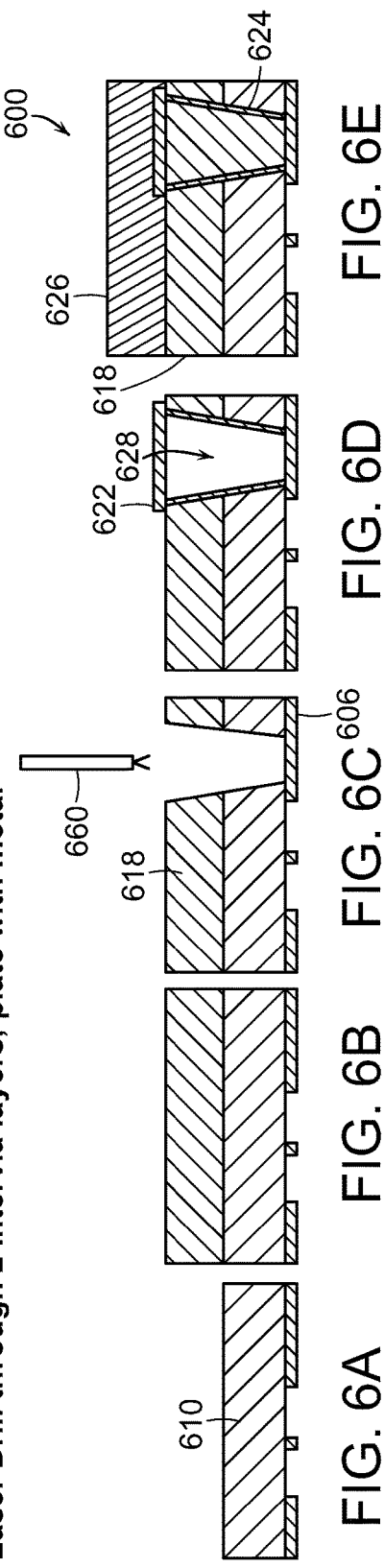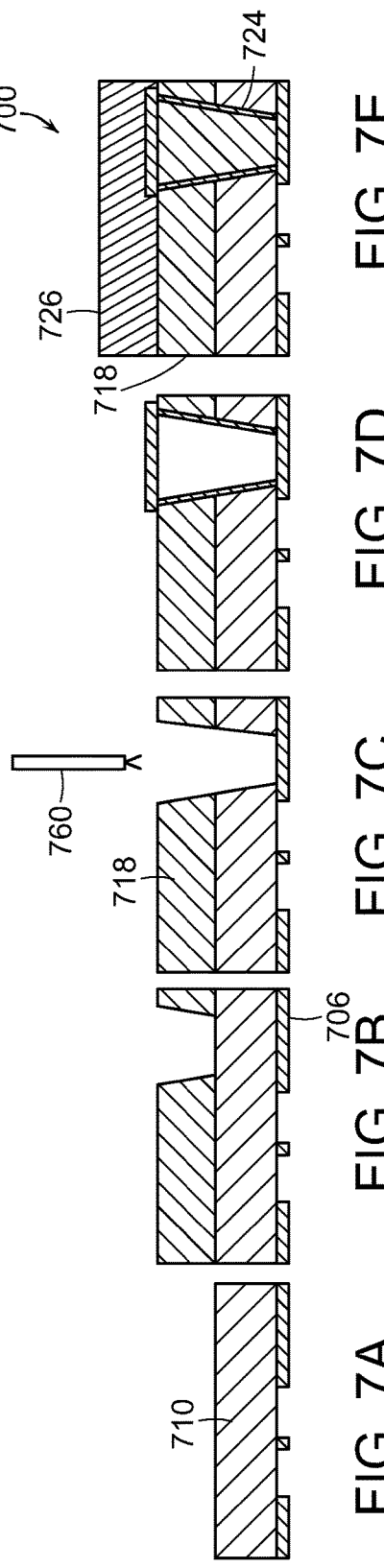

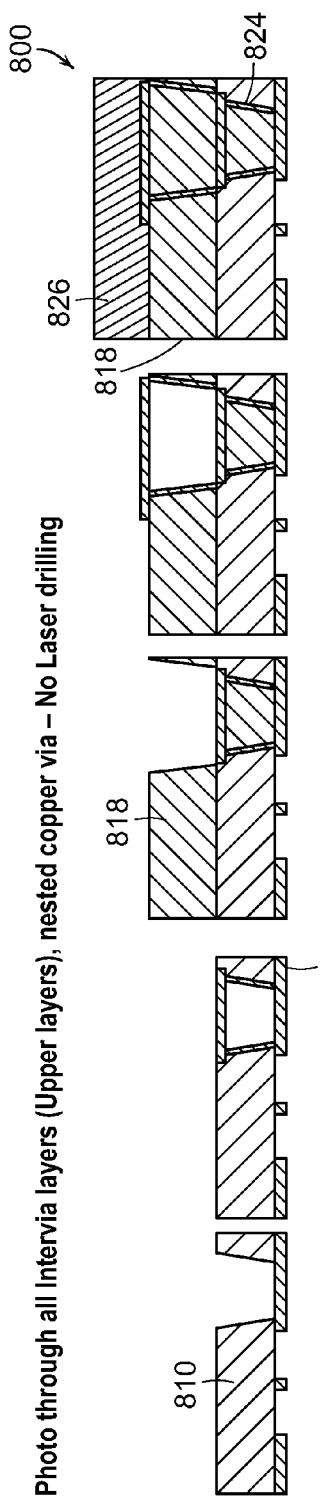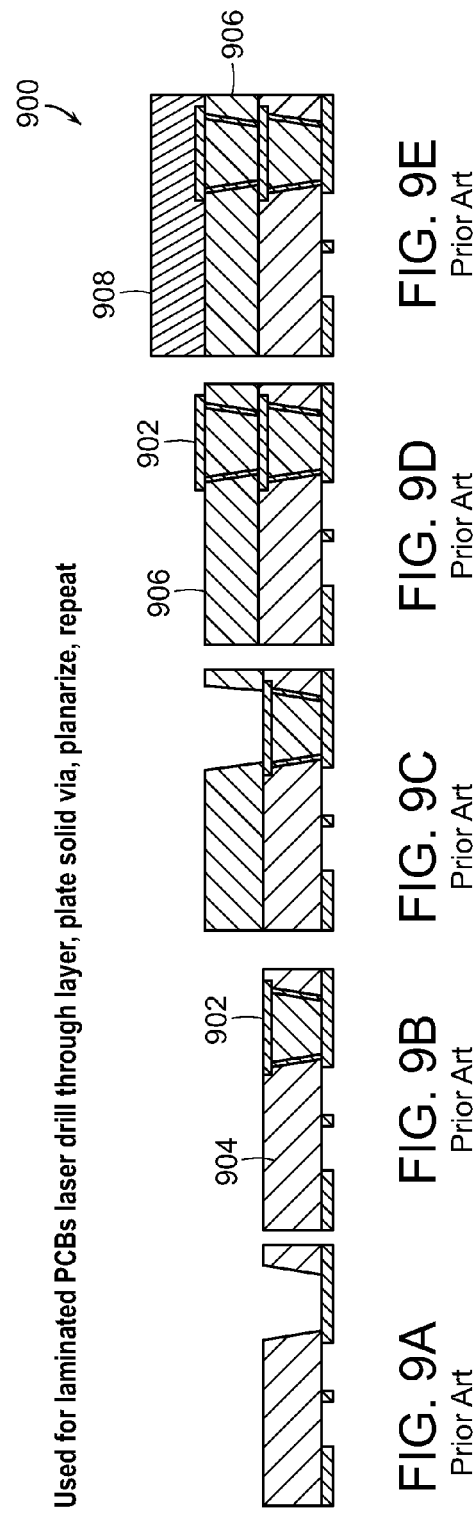

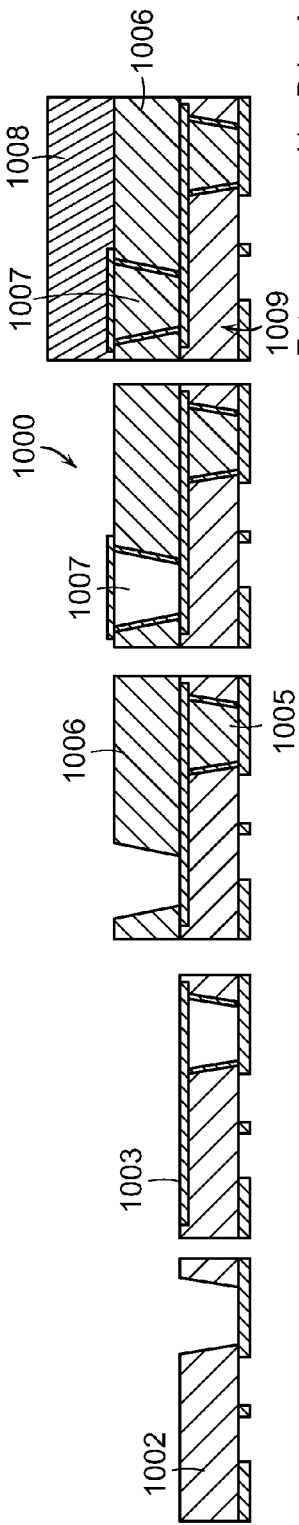
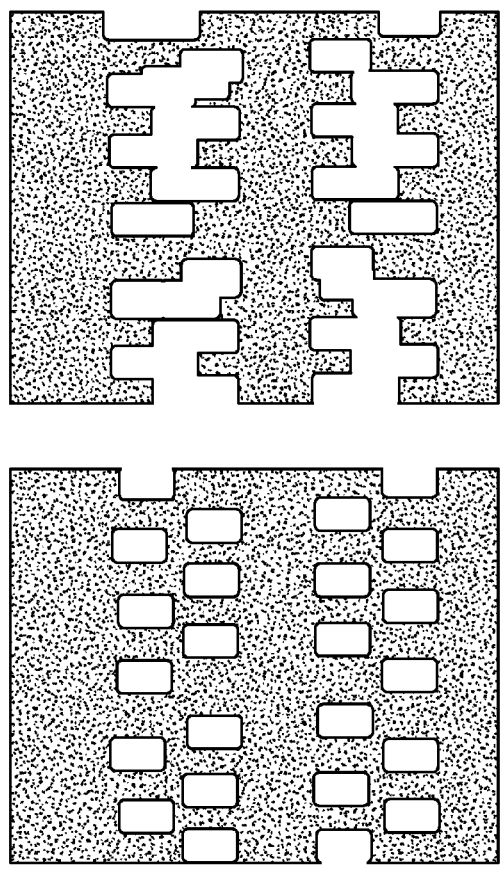

METHOD AND APPARATUS FOR FORMING MULTI-LAYERED VIAS IN SEQUENTIALLY FABRICATED CIRCUITS

INCORPORATION BY REFERENCE

This application further expressly incorporates by reference and makes a part hereof the U.S. Provisional Patent Application Ser. No. 62/164,782, filed May 21, 2015.

TECHNICAL FIELD

The present disclosure relates generally to lamination based printed circuit boards, and, more particularly, to improved multi-layer buried vias in such printed circuit boards (PCBs).

BACKGROUND

Reconstructed wafers, including high density electronic devices, are typically formed by fabricating a silicon wafer with embedded electronic modules (e.g., chip scale components) using a molding process. Most embedded chip scale components, referred to as electronic modules, include various circuitry contained within a housing and electrical contacts along one surface or another of the housing. During the molding processes, the desired chip scale components are typically oriented on a mounting surface with the electrical contacts facing upward or downward relative to the mounting surface. That is, the electrical contacts along the surface of the housing are located on a housing surface proximate the mounting surface or on a housing surface opposite thereof. As the housings may be stacked, electronic contacts and vias must be provided in order to electrically connect the housing during fabrication steps. Particular care is taken so that the reconstructed wafers can utilize traditional semiconductor manufacturing equipment, processes and technology for such fabrication.

Integrated-ultra high density (iUHD) circuits often contain sub-modules stacked on other sub-modules. The iUHD circuits and sub-modules are formed by sequential deposition and patterning of dielectric and metal layers in a reconstructed wafer process. Multi-layer buried vias are used to create interconnections. Lamination based PCB technology also allows for multi-layer buried vias. Such multi-layered buried vias may be entirely contained (i.e., not exposed externally at either surface).

For example, a portion of a typical laminated printed circuit board 900 is shown in FIGS. 9A-E in various stages of fabrication. In FIGS. 9A-E, multi-layered vias 902 is used to create interconnections between layers 904, 906, 908 and circuitry (not shown). The vias 902 are commonly fabricated in build-up circuits by forming the vias 902 at each layer 904, 906, 908. Upon formation, each via 902, effectively a hole, must be filled and planarised as each of layer 904, 906, and 908 is formed. As can be seen, the filled and planarised holes are stacked to create the vias 902. This technology is typically only useful at geometries above 19 µm.

Creating such filled vias requires extra processing and capabilities that are difficult and not universally available. Additionally, the filling and planarising of the filled vias poses a significant fabrication challenge. Still further, the vias need to be stacked, which increases fabrication complexity on each layer.

Referring now to FIGS. 10A-E, a portion of a typical reconstructed wafer 1000 is shown in FIGS. 10A-E in various stages of fabrication. As the reconstructed wafer 1000 may utilize semiconductor fabrication systems and methods, smaller geometries, say down to 5 µm, may be accomplished. However, a metal pad 1003 must be place on layer 1002. Via 1005 can be filled as the second layer 1006 is formed. As best seen in FIG. 10D, a second via 1007 can be formed and filled when the next layer 1008 is formed (see FIG. 10E). As can be seen, the vias 1005, 1007 inefficiently zig-zag upwards (the zig-zag or extra area is also commonly referred to as a job or dog-bone).

For iUHD applications particularly, these filled vias that dog-bone across intermediate layers undesirably consume real estate. The necessary punctured planes and complicated routing are also undesirable. Further, the lengthened connection pathways increase the resistance of the connection.

SUMMARY

In view of the above, there is a need for improved multi-layer buried vias and methods for fabricating the buried vias. The vias can also minimize the consumed real estate and simplify routing. The vias can create shortened connection pathways to reduce the resistance of the connections.

In one aspect, an electronics module assembly is featured. The electronic module assembly comprises a first layer deposited upon a substrate, a second layer deposited on a top surface of the first layer; and a first via spanning multiple layers. The first via can include a first bottom formed on a top surface of a first layer and a first sidewall upstanding from the first bottom and extending at least through a second layer deposited on the top surface of the first layer.

In another aspect, a method of forming vias in a wafer based module is featured. The featured method includes depositing a first layer upon a substrate, forming a plurality of conductive pads on a top surface of the first layer, forming a second layer upon the first layer, such that the second layer is formed on at least a portion of the conductive pads and the second layer is patterned to define spaces above first and second conductive pads, and applying a conductive layer to fill in the spaces above the first and second conductive pads.

In other examples, any of the above aspects, or any system, method, apparatus, and computer program product method described herein, can include one or more of the following features.

The first bottom and the first sidewall can define a space partially enclosed by the first bottom and the first sidewall. The space can be filled with a dielectric or a metal. A third layer can be deposited on the second layer and the space may be filled with the third layer. The first bottom can be a portion of a pad deposited on the top surface of the first layer.

The electronic module assembly can include a first top portion in a flange-shape, the first top portion can be formed integrally with the sidewall on a top surface of the second layer.

The electronic module assembly can include a second that spans multiple layers. The second via can include a second bottom formed on the top surface of the first layer, a second sidewall upstanding from the second bottom and extending at least through the second layer deposited on the top surface of the first layer, and a cross-over top portion deposited on the second layer and connecting the first and second sidewalls. The cross-over top portion can be integrally and simultaneously formed with the first and second sidewalls.

The electronic module assembly can include a first sidewall that extends through the second layer and a third layer deposited on a top surface of the second layer. The electronics module can further include a second bottom formed on the top surface of the first layer, a second sidewall upstanding from the second bottom and extending through the second and third layers, and a cross-over top portion deposited on the third layer and connecting the second via and a third via. The first sidewall can be a truncated cone in shape. The first sidewall can have a top portion, a second bottom formed on the top portion of the first sidewall, and a second sidewall upstanding from the second bottom and extending at least through a third layer deposited on a top surface of the second bottom.

Further, portions of the second layer can be removed to define a second space above the second pad and a second sidewall inside of the second space can be formed such that the second sidewall upstands from the second pad and extends at least through the second layer It should be appreciated that the present technology can be implemented and utilized in numerous ways, including without limitation as a process, an apparatus, a system, a device, a method for applications now known and later developed or a computer readable medium.

Other aspects and advantages of the invention can become apparent from the following drawings and description, all of which illustrate the principles of the invention, by way of example only.

BRIEF DESCRIPTION OF THE DRAWINGS

The advantages of the invention described above, together with further advantages, may be better understood by referring to the following description taken in conjunction with the accompanying drawings. The drawings are not necessarily to scale, emphasis instead generally being placed upon illustrating the principles of the invention.

FIGS. 6A-E illustrate cross-sectional views of an assembly having vias at various stages of manufacture in accordance with embodiments disclosed herein.

FIGS. 7A-E illustrate cross-sectional views of another assembly having vias at various stages of manufacture in accordance with embodiments disclosed herein.

FIGS. 8A-E illustrate cross-sectional views of still another assembly having vias at various stages of manufacture in accordance with embodiments disclosed herein.

FIGS. 9A-E illustrate cross-sectional views of a conventional via arrangement.

FIGS. 10A-E illustrate cross-sectional views of a second conventional via arrangement.

FIG. 11 is a top view of a layer of an assembly that can be used with embodiments disclosed herein.

FIG. 12 is a top view of a layer of a prior art assembly.

DESCRIPTION

Figure 1:
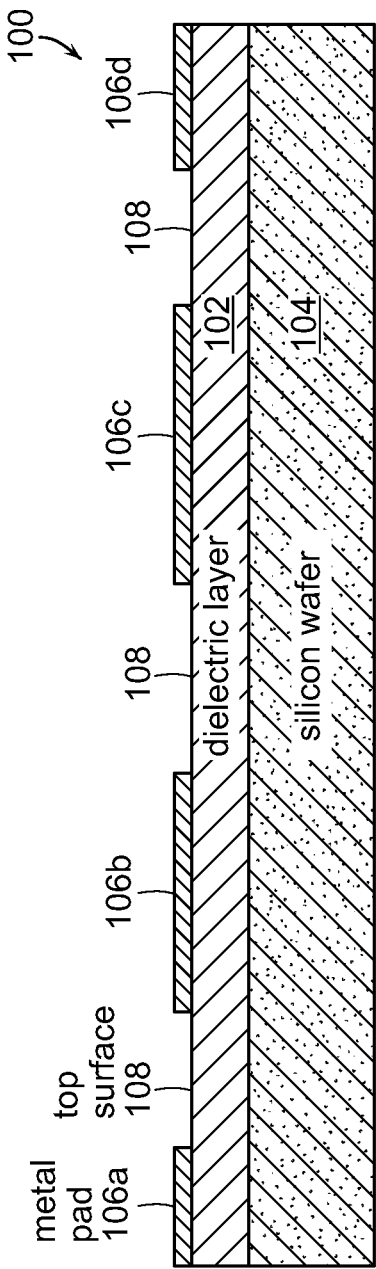
FIG. 1 illustrates a cross-sectional view of an iUHD assembly at an early stage having only a single layer laid down upon a substrate such as a wafer in accordance with embodiments disclosed herein.

The present disclosure overcomes many of the prior art problems associated with multi-layer buried vias in lamination based PCBs and iUHD applications. The advantages, and other features of the structures and methods disclosed herein, will become more readily apparent to those having ordinary skill in the art from the following detailed description of certain preferred embodiments taken in conjunction with the drawings which set forth representative embodiments of the present invention and wherein like reference numerals identify similar structural elements.

All relative descriptions herein such as left, right, up, and down are with reference to the Figures, and not meant in a limiting sense. Additionally, for clarity common items and circuitry such as integrated circuits, resistors, capacitors, transistors, and the like, have not been included in the Figures as can be appreciated by those of ordinary skill in the pertinent art. Unless otherwise specified, the illustrated embodiments can be understood as providing example features of varying detail of certain embodiments, and therefore, unless otherwise specified, features, components, modules, elements, and/or aspects of the illustrations can be otherwise combined, interconnected, sequenced, separated, interchanged, positioned, and/or rearranged without materially departing from the disclosed systems or methods. Additionally, the shapes and sizes of components are also examples and unless otherwise specified, can be altered without materially affecting or limiting the disclosed technology.

In brief overview, methods for fabricating multi-layer buried vias without requiring filling and planarising vias are described. The multi-layer buried vias directly connect traces on distant layers without having to zig-zag across intermediate layers. As a result, the multi-layer buried vias are also more compact with reduced connection resistance for the connection and the planes. Fabrication is also easier because the number of required metal layers is reduced. Further, the structure of the multi-layer buried vias themselves is novel and non-obvious in view of prior art filled vias. The subject technology is applicable to iUHD, lamination based PCBs and similar processes used for embedded die packages. The subject technology is particularly useful for embedding high power die (e.g., die of power greater than 1 OW) in iUHD applications.

FIGS. 1-4, collectively, illustrate an example fabrication process for multi-layer buried vias in accordance with the subject technology. In particular, FIGS. 1-4 illustrate views of an iUHD assembly 100 in subsequent fabrication steps. The iUHD assembly 100 includes a plurality of electronic modules and other devices that are not shown to allow for increased clarity in the figures. For example, the iUHD assembly 100 may include micro-electromechanical (MEM) sensors, one or more die, integrated circuits (ICs) and the like. It can be also appreciated that the views shown in FIGS. 1-4 are provided for purposes of discussion, and not limitation, where various features may certainly be configured and arranged differently.

FIG. 1 illustrates the iUHD assembly 100 at an early stage having only a single layer 102 laid down upon a substrate such as a wafer 104. The layer 102 may be any desired type such as a dielectric layer etc. A plurality of pads 106a-d of planar metal are formed on a top surface 108 of the layer 102. These pads 106a-d will become the bottoms of the multi-layer buried vias. Pads 106a, 106d are only partially shown. It is envisioned that the pads 106a-d are all the same configuration but a variety of shapes and sizes is possible. In one embodiment, the pads 106a-d are circular and about 25 μm in diameter with the layer 102 being about 7 μm thick. Ovals, squares, rectangles, triangles and other shapes are all useful in the subject technology. The pads 106a-d can be metal and formed using conventional semiconductor fabrication equipment and techniques such as deposition and micro-photolithography.

Figure 2A:
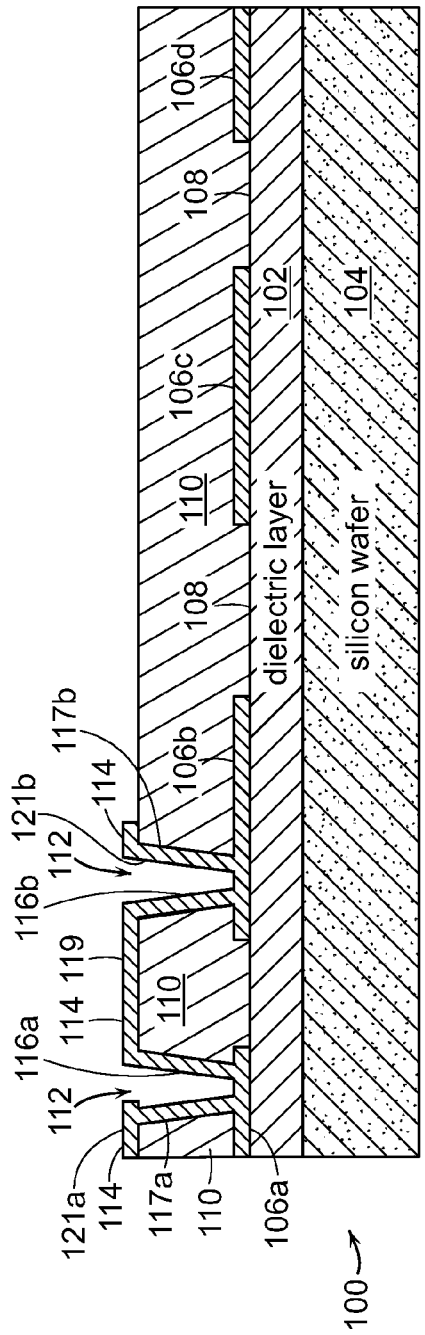
FIG. 2A illustrates a cross-sectional view of an intermediate layer and a metal layer formed upon the initial layer and pads of FIG. 1 in accordance with embodiments disclosed herein.

Referring now to FIG. 2A, the iUHD assembly 100 is illustrated having an intermediate second layer 110 formed upon the initial layer 102 and pads 106a-d. The second layer 110 is patterned, by photolithography, to leave spaces 112 above pads 106a, 106b. Next, a metal layer 114 is patterned to only fill in the spaces 112 above pads 106a, 106b, thereby creating sidewalls 117a, 117b. As a result, two multi-layer vias 116a, 116b are created.

Figure 2B:
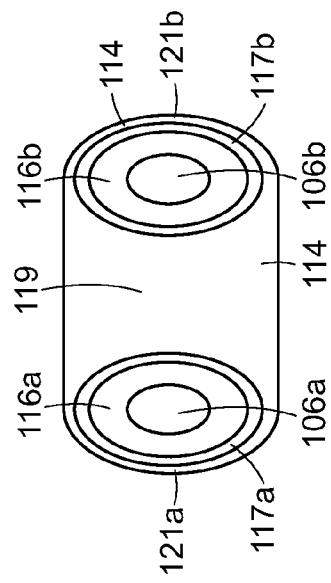
FIG. 2B illustrates a partial top view centered on the vias of FIG. 2A in accordance with embodiments disclosed herein.

Referring additionally to FIG. 2B, a top view of the multi-layer vias 116a, 116b of FIG. 2A is shown. The two multi-layer vias 116a, 116b have a top portion 119 spanning between the sidewalls 117a, 117b to connect pads 106a, 106b. The left top portion 121a of via 116a or the right top portion 121b of via 116b may also connect to other components or pads (not shown) or simply be formed as illustrated. The second layer 110 and metal layer 114 can be formed using photographic techniques such as deposition, sputtering, micro-photolithography and conventional semiconductor fabrication equipment and techniques.

Alternatively or additionally, the pads 106a-d can be circular and about 25 μm in diameter, the top of the spaces 112 is also circular and about 30 μm in diameter. As a result, the sidewalls 117a, 117b of the vias 116a, 116b can be slightly retrograde, which is drawn in an exaggerated manner for illustration. Typically, the angle of the sidewalls 117a, 117b can be 88° or more but just enough to insure reliable connection by sputtering.

Figure 3:
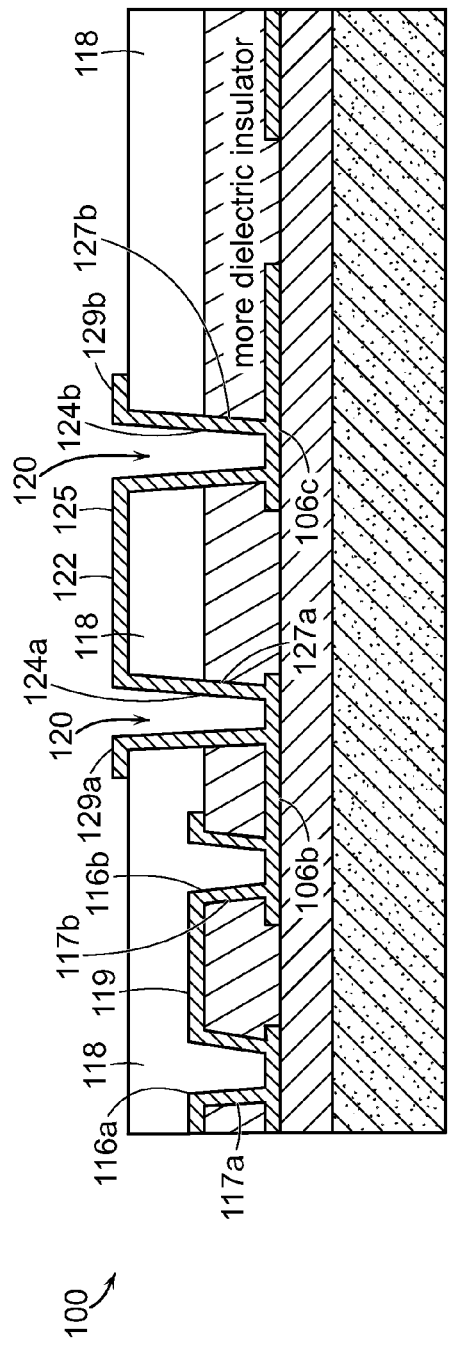
FIG. 3 illustrates a cross-sectional view of two multi-layer vias buried in a third layer in accordance with embodiments disclosed herein.

Referring now to FIG. 3, the iUHD assembly 100 is illustrated having the two multi-layer vias 116a, 116b buried in a third layer 118. The third layer 118 is also a dielectric, which may be the same or different from the second layer 102. The third layer 118 is removed to leave spaces 120 above pads 106b, 106c. Another metal layer 122 can be patterned to only fill in the spaces 120 above pads 106b, 106c. As a result, two more multi-layer vias 124a, 124b can be created. These two multi-layer vias 124a, 124b have a top portion 125 that connect pads 106b, 106c and span across the second and third layers 110, 118. Each multi-layer via 124a, 124b also has an unconnected top portion 129a, 129b that may be otherwise electrically connected to a component or device not shown.

The third layer 118 and additional metal layer 122 can be formed using photographic techniques such as deposition, micro-photolithography and conventional semiconductor fabrication equipment and techniques. For example, the spaces 120 can be formed by drilling before metal is deposited. The drilling can be laser drilling and/or mechanical drilling. For example, the spaces 120 can be formed by chemical etching. Even though the multi-layer vias 124a, 124b can be taller than the vias 116a, 116b, the multi-layer vias 124a, 124b can still have pads 106b, 106c of about 25 μm in diameter with tops of the spaces 120 being about 30 μm in diameter to maintain a retrograde angle to the sidewalls 127a, 127b.

Figure 4:
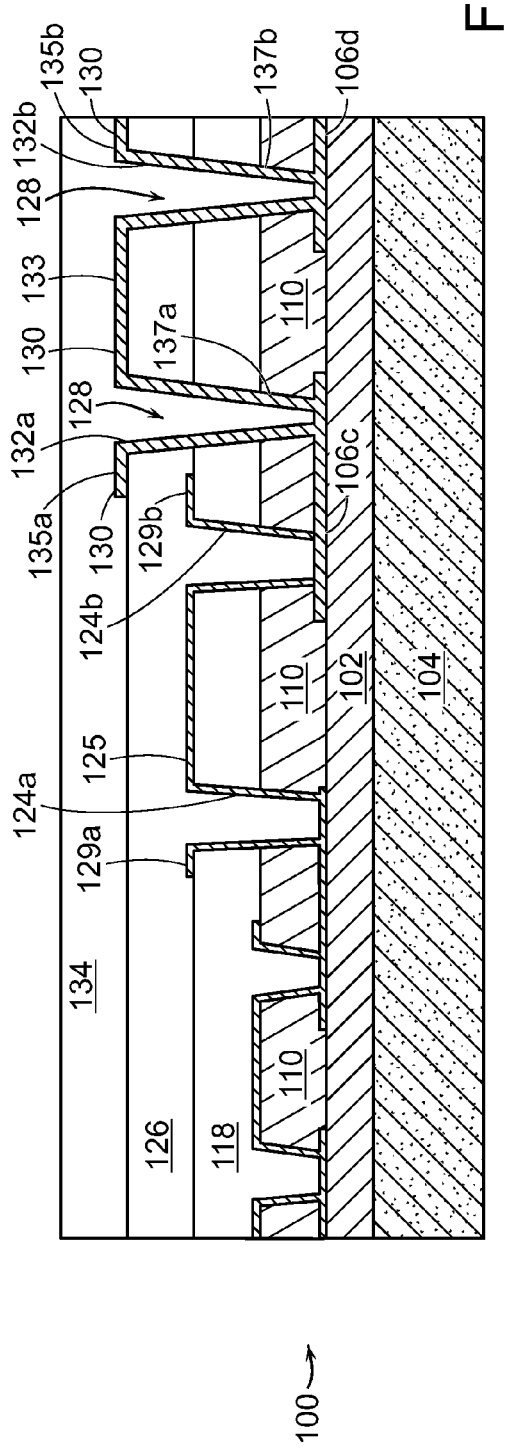
FIG. 4 illustrates cross-sectional view of the iUHD assembly having the multi-layer vias buried in a fourth layer in accordance with embodiments disclosed herein.

Referring now to FIG. 4, the iUHD assembly 100 is illustrated having the multi-layer vias 124a, 124b buried in a fourth layer 126. The fourth layer 126 is also partially removed to leave spaces 128 above pads 106c, 106d. Another metal layer 130 can be patterned to only fill in the spaces 128 above pads 106c, 106d. As a result, two more multi-layer vias 132a, 132b can be created. These two multi-layer vias 132a, 132b similarly have a top portion 133 that connect the two vias 132a, 132b and, in turn, the two pads 106c, 106d together.

Each multi-layer vias 132a, 132b also has an unconnected top portion 135a, 135b that may be otherwise electrically connected to a component or device not shown. For example, even though the multi-layer vias 132a, 132b span three or more layers, each of which may be 7 μm or more thick, the multi-layer vias 132a, 132b can still maintain a retrograde angle to the sidewalls 137a, 137b.

The spaces 128 can be formed by drilling before metal is deposited. For example, the spaces 128 can be formed by chemical etching. The iUHD assembly 100 can also include a fifth layer 134 that covers the multi-layer vias 132a, 132b. The fourth layer 126 and fifth layer 134 can be formed using photographic techniques such as deposition, micro-photolithography and conventional semiconductor fabrication equipment and techniques.

As a result of the process of FIGS. 1-4, a plurality of buried multi-layer vias 116a, 116b, 124a, 124b, 132a, 132b are formed. These vias 116a, 116b, 124a, 124b, 132a, 132b have bottom 106a-b with upstanding sidewalls 117a, 117b, 127a, 127b, 137a, 137b. In effect, the vias 116a, 116b, 124a, 124b, 132a, 132b are in the shape of a truncated cone. The buried multi-layer vias could also be largely frusto-conical in shape, oval or rectangular in horizontal cross-section and various other shapes depending upon the design and fabrication methodology used. The bottom of the vias can be flat with top portions that either connect to other vias and/or components as well as lend structural support.

The vias 116a, 116b, 124a, 124b, 132a, 132b can be arranged such that they are not filled in the traditional manner, which makes for easier fabrication than prior art techniques. However, the vias can be filled with a dielectric or any other material as desired. As shown in FIGS. 3-4, the vias 116a, 116b, 124a, 124b, 132a, 132b are simply filled by the same material as the layer 118, 126, 134 above. The size, location and arrangement of the vias in an assembly may also vary. For example, the vias can be arranged according to a grid or other pattern or simply placed according to need in which the resulting arrangement appears random.

Figure 5:
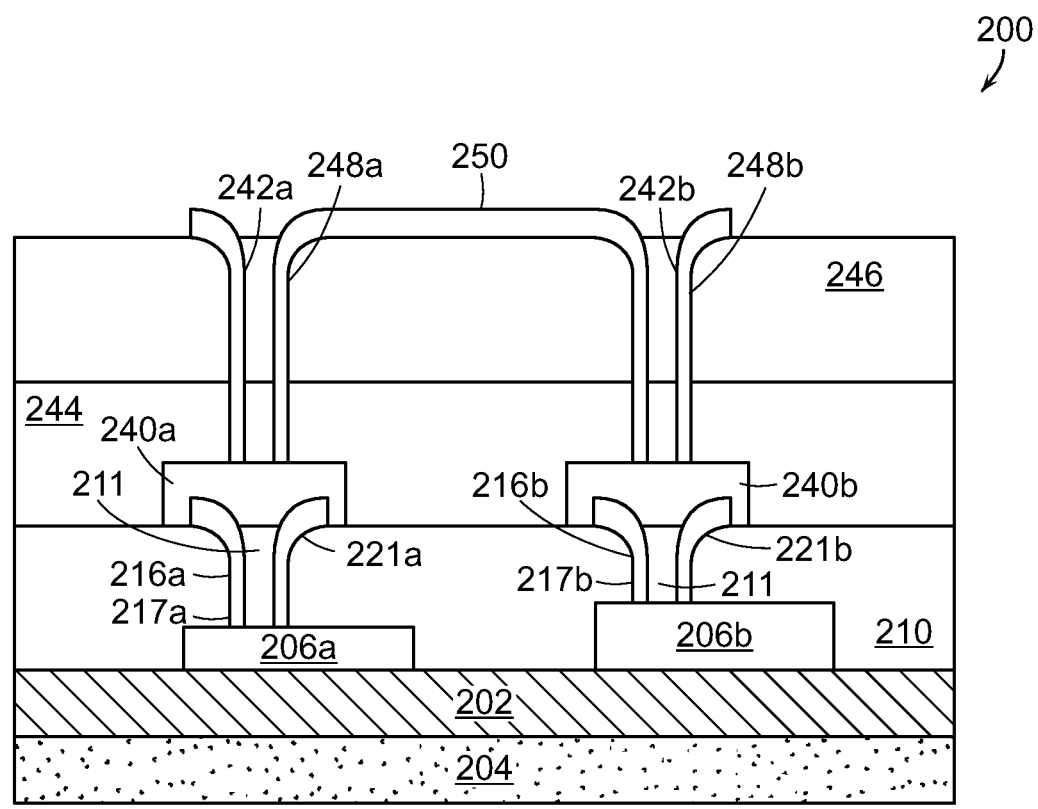
FIG. 5 illustrates cross-sectional view of another iUHD assembly having multi-layer vias in accordance with embodiments disclosed herein.

Turning to FIG. 5, another iUHD assembly having stacked multi-layer vias in accordance with the subject technology is shown. As will be appreciated by those of ordinary skill in the pertinent art, the iUHD assembly 200 utilizes similar principles to the iUHD assembly 100 described above. Accordingly, like reference numerals preceded by the numeral "2" instead of the numeral "1" are used to indicate like elements. The primary difference of the iUHD assembly 200 in comparison to the iUHD assembly 100 is that the vias are stacked.

To form the stacked vias in FIG. 5, the initial fabrication is the same as shown in FIG. 2A above. The vias 216a, 216 are filled with a dielectric 211. The dielectric 211 may be the same as dielectric 210 or some different material but it is envisioned that the dielectric 211 is formed after the sidewalls 217a, 217b of the vias 216a, 216b. Once the dielectric 211 is formed, another metal layer is deposited to create pads 240a, 240b over the top portions 221a, 221b of the vias 216a, 216b, respectively. The pads 240a, 240b become the bottoms of the second level vias 244a, 242b.

In order to form the second level vias 242a, 242b, one or more layers 244, 246 are formed on the pads 240a, 240b. Portions of the layers 244, 246 above the pads 240a, 240b can be removed, by drilling, etching or otherwise, so that metal can be formed to create the sidewalls 248a, 248b as well as the top connecting portion 250 of the second level vias 244a, 242b. Once the second level vias 242a, 242b are filled with another layer (not shown), the process can continue up to stack as many vias as desired. In one embodiment, each successive via has a larger bottom than the top of the via below.

Referring now to FIGS. 6A-E, cross-sectional views of an assembly having vias at various stages of manufacture in accordance with the subject technology are illustrated. As will be appreciated by those of ordinary skill in the pertinent art, the assembly 600 utilizes similar principles to the wafer 100 described above. Accordingly, like reference numerals preceded by the numeral "6" instead of the numeral "1", are used to indicate like elements. In this embodiment, a multi-layer via 628 is created with a laser drill 660. A metal plate 622 covers the via 628.

Referring now to FIGS. 7A-E, cross-sectional views of an assembly having vias at various stages of manufacture in accordance with the subject technology are illustrated. As will be appreciated by those of ordinary skill in the pertinent art, the assembly 700 utilizes similar principles to the assembly 600 described above. Accordingly, like reference numerals preceded by the numeral "7" instead of the numeral "6", are used to indicate like elements. The primary difference is that the method for making assembly 700 utilizes photolithography to create a hole in the second layer 718 and a laser drill 760 to extend the hole through the first layer 710. The via 724 can be formed in the hole.

Referring now to FIGS. 8A-E, cross-sectional views of an assembly having vias at various stages of manufacture in accordance with the subject technology are illustrated. As will be appreciated by those of ordinary skill in the pertinent art, the assembly 800 utilizes similar principles to the assembly 700 described above. Accordingly, like reference numerals preceded by the numeral "8" instead of the numeral "7", are used to indicate like elements. The primary difference is that the method for making assembly 800 utilizes photolithography to create a multi-layer via 824. The hole in the second layer 818 is slightly large so as to sit on the flange on top of the first layer 810.

Embodiment described herein preserve real estate without requiring changes to the metallization process or addition of planarization. The resulting vias have lower resistance and more efficient signal routing, which may allow fewer layers.

The subject technology also provides more efficient power distribution. FIG. 11 is a top view of a layer of an assembly using the subject technology as compared to FIG. 12, which is a top view of a layer of a prior art assembly. As can be seen, the increased plane area in FIG. 11 reduces the resistance of the power distribution planes in the circuit in combination with the vias themselves having lower resistance. The resulted in an improvement for high power devices.

As can be appreciated by those of ordinary skill in the art based upon review of the subject disclosure, the present technology has wide and varied applications. For example, embedding high power die, such as those operating above 10 W in iUHD, buried multi-layer vias will be advantageous. Commercially embedded die packages are going to increase the number of metal layers, in which case, the present buried multilayer vias and methods for making the same will again be useful. Similarly, as other thin-film based multi-chip module processes introduce higher power devices, the subject technology is particularly applicable and advantageous.

In view of the above, it will be appreciated that the present buried multilayer vias improve the routability of high density components along with reduced resistance of connections and planes. The buried multi-layer vias will help with power distribution requirements in embedded high power die in iUHD and similar applications. Further, the fabrication methods disclosed herein can use conventional materials, manufacturing equipment, and processes to increase efficiency. Additionally, buried multi-layer vias in accordance with the subject technology have proven to be robust. For example, environmental life characterization of 1000 cycles between −55° C. and 125° C. has been accomplished.

While the foregoing description has been directed to specific embodiments, it will be apparent, however; that other variations and modifications may be made to the described embodiments, with the attainment of some or all of their advantages. Accordingly this description is to be taken only by way of example and not to otherwise limit the scope of the embodiments herein. Therefore, it is the object of the appended claims to cover all such variations and modifications as come within the true spirit and scope of the embodiments herein.

What is claimed is:

1. An electronics module assembly, comprising:
a first layer deposited upon a substrate;
a second layer deposited on a top surface of the first layer;
a first via spanning multiple layers comprising a first bottom formed on the top surface of the first layer, and a first sidewall upstanding from the first bottom and extending at least through the second layer; and
a second via spanning multiple layers comprising a second bottom formed on the top surface of the first layer, and a second sidewall upstanding from the second bottom and extending at least through the second layer, a first cross-over top portion deposited on a third layer deposited on the second layer and configured to connect the first via and the second via, wherein the second bottom is connected to a third via that extends through a third layer formed above the second layer such that the second and third vias span different layers, and the third via has a second crossover top portion that is connected to the second bottom.

2. The electronics module assembly of claim 1 wherein the first bottom and the first sidewall define a first space partially enclosed by the first bottom and the first sidewall.

3. The electronics module assembly of claim 2 wherein the first space is filled with at least one of a dielectric or a metal.

4. The electronics module assembly of claim 2, wherein the first space is filled with the third layer.

5. The electronics module assembly of claim 1 wherein the first bottom and the first sidewall are configured to be conductive.

6. The electronics module assembly of claim 1, further comprising a first top portion in a flange-shape formed integrally with a sidewall on a top surface of the second layer.

7. The electronics module assembly of claim 1 wherein the first bottom is a portion of a pad deposited on the top surface of the first layer.

8. The electronics module assembly of claim 1 wherein the first cross-over top portion is integrally and simultaneously formed with the first sidewall and the second sidewall.

9. The electronics module assembly of claim 1, wherein the second cross-over top portion is deposited on a fourth layer and configured to connect the third via to a fourth via.

10. The electronics module assembly of claim 1 wherein the first sidewall is a truncated cone in shape.

11. The electronics module assembly of claim 1 wherein the first sidewall has a top portion and the second sidewall extends at least through the third layer.

* * * * *